(12) United States Patent
Bedell et al.

(10) Patent No.: US 7,141,115 B2
(45) Date of Patent: Nov. 28, 2006

(54) METHOD OF PRODUCING SILICON-GERMANIUM-ON-INSULATOR MATERIAL USING UNSTRAINED GE-CONTAINING SOURCE LAYERS

(75) Inventors: Stephen W. Bedell, Wappingers Falls, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 10/932,598

(22) Filed: Sep. 2, 2004

(65) Prior Publication Data

US 2006/0042542 A1   Mar. 2, 2006

(51) Int. Cl.
*C30B 25/12* (2006.01)

(52) U.S. Cl. ............................ 117/92; 117/89; 117/102; 117/105

(58) Field of Classification Search .................. 117/89, 117/92, 102, 105
See application file for complete search history.

(56) References Cited

U.S. PATENT DOCUMENTS

| | | | |
|---|---|---|---|
| 6,515,335 B1 * | 2/2003 | Christiansen et al. | 257/347 |
| 6,855,436 B1 * | 2/2005 | Bedell et al. | 428/641 |

* cited by examiner

*Primary Examiner*—Felisa Hiteshew
(74) *Attorney, Agent, or Firm*—Scully, Scott, Murphy & Presser,P.C.; Robert M. Trepp, Esq.

(57) ABSTRACT

A method of fabricating a high-quality relaxed SiGe-on-insulator substrate material is provided in which a prefabricated silicon-on-insulator substrate is first exposed to an unstrained Ge-containing source and then heated (annealed/oxidized) to cause Ge diffusion and thermal mixing of Ge within a single-crystal Si-containing layer of the prefabricated silicon-on-insulator substrate. The unstrained Ge-containing source can comprise a solid Ge-containing source, a gaseous Ge-containing source, or ions of Ge.

24 Claims, 6 Drawing Sheets

METHOD OF PRODUCING SILICON-GERMANIUM-ON-INSULATOR MATERIAL USING UNSTRAINED GE-CONTAINING SOURCE LAYERS

RELATED APPLICATIONS

This application is related to U.S. application Ser. No. 10/696,601, filed Oct. 29, 2003, U.S. application Ser. No. 10/448,947, filed May 30, 2003, and U.S. application Ser. No. 10/055,138, filed Jan. 23, 2002. The entire content of each of these related applications is incorporated herein by reference.

FIELD OF THE INVENTION

The present invention relates to a semiconductor substrate material, and more particularly to a method of fabricating a silicon germanium-on-insulator (SGOI) substrate material using an unstrained Ge-containing source material.

BACKGROUND OF THE INVENTION

In the semiconductor industry, there has recently been a high-level of activity using strained Si-based heterostructures to achieve high carrier mobility structures for complementary metal oxide semiconductor (CMOS) applications. Traditionally, to boost performance of NFET and PFET devices, the prior art method to implement this has been to grow strained Si layers on thick (on the order of from about 1 to about 5 micrometers) relaxed SiGe buffer layers.

In order to produce relaxed SiGe material on a Si substrate, prior art methods typically grow, via epitaxy, a uniform, compositionally-graded or stepped SiGe layer to beyond the metastable critical thickness (i.e., the thickness beyond which dislocations form to relieve stress) on a single crystalline substrate, i.e., Si, and allow misfit dislocations to form, with the associated threading dislocations, through the SiGe buffer layer. Because the lattice parameter of SiGe is larger than that of Si, a compressive strain exists in the alloy layer as it is grown on Si.

When a typical prior art metastable strained SiGe layer is annealed at a sufficiently high temperature, misfit dislocations will form and grow thereby relieving the total strain on the film. In other words, the initial elastic strain of the film is relieved by the onset of plastic deformation of the crystal lattice. For the case of prior art metastable strained SiGe grown on a silicon-on-insulator (SOI) substrates, experiments have shown that under most annealing/oxidation conditions, the formation of misfit dislocations occurs early in the annealing history for temperatures greater than about 700° C.

Many of these defects are then either consumed or annihilated during the high-temperature annealing of the structure, however, the surface topography of the original misfit array persists during oxidation. Furthermore, SGOI substrate materials fabricated by thermal diffusion do not completely relax the SiGe alloy layer. Instead, the final SiGe lattice expands only to some fraction of the equilibrium value. If thick strained SiGe layers are grown on SOI substrates to allow greater relaxation during the subsequent thermal mixing procedure, then dislocations can be formed during the deposition of the film. Therefore, there is an upper limit to the thickness that the metastable SiGe layer can be formed on the SOI substrate without introducing defects in the as-grown material. If the deposited SiGe layer is unstrained (relaxed), then thick layers could be grown on SOI substrates without forming dislocations during growth.

In addition to growing thick SiGe layers atop an SOI substrate and then relaxing the SiGe layer by annealing/oxidation, it is also known to form SiGe-on-insulator substrates by wafer bonding and/or by oxygen implantation. These techniques for forming SGOI substrates require complicated and/or extra processing steps, which add additional time and/or cost to the production of the SGOI material.

Despite the above techniques for forming SGOI substrate materials, there is still a need for providing another method that is capable of forming highly-relaxed SiGe alloy layers over an insulating layer.

SUMMARY OF THE INVENTION

The present invention provides a method of obtaining high-quality, highly-relaxed SiGe alloy layers on an insulator layer that is located atop a substrate. Hence, the method of the present invention provides a method of fabricating a high-quality, single-crystal relaxed SiGe-on-insulator substrate material. The term "high quality" is used in the present invention to denote that the SiGe alloy layer of the SGOI substrate material has a defect density, including misfits, threading dislocations, stacking faults, and microtwins, of less than about $5 \times 10^7$ defects/cm$^2$.

In accordance with the method of the present invention, a single-crystal Si-containing surface of a Si-containing layer is exposed to an unstrained Ge-containing source that is capable of either forming an unstrained Ge-containing layer on the single-crystal surface or introducing Ge directly into the Si-containing layer. The unstrained Ge-containing layer is formed when a solid Ge-containing source is employed, while a gaseous Ge-containing source or a Ge-containing ion source is used to introduce Ge into the Si-containing layer. When an unstrained Ge-containing layer is formed, there is no limit on the thickness or composition of the Ge-containing layer since the Ge-containing layer formed does not include strain as is the case in prior art processes in which epitaxy is used. Moreover, the growth of the unstrained Ge-containing layer occurs at the single-crystal Si-containing surface. No growth interface is present when a gaseous Ge-containing source or a Ge-containing ion source is employed.

After exposing the single-crystal Si-containing surface to an unstrained Ge-containing source, the structure is then subjected to a high-temperature annealing/oxidation step which is capable of allowing Ge provided by the unstrained Ge-containing source to diffuse into the SOI layer of the prefabricated SOI substrate, while simultaneously forming a surface oxide layer that acts as a diffusion barrier to Ge.

In the embodiment in which a solid Ge-containing source is employed, the unstrained Ge-containing layer is consumed during the course of the annealing/oxidation step while the total Ge content is maintained.

Due to the high temperatures used in the present invention during the annealing/oxidation step, equilibrium conditions are maintained and the strain that develops as a result of the Ge flux into the SOI lattice is relieved by defect production and annihilation or elastic expansion in the case of islands structures whose length is less than 100 μm. The result of the above processing steps of the present invention is the formation of a relaxed, high-quality single-crystal SiGe alloy layer above the original barrier layer of the SOI substrate.

In broad terms, the method of the present invention thus comprises the steps of:

exposing a single-crystal Si-containing layer of a prefabricated silicon-on-insulator substrate to an unstrained Ge-containing source; and heating the substrate that was exposed to said unstrained Ge-containing source to cause diffusion of Ge provided by said unstrained Ge-containing source into said single-crystal Si-containing layer thereby forming a relaxed, single-crystal SiGe alloy layer on a barrier layer of said prefabricated SOI substrate.

In some embodiments of the present invention, it is contemplated to pattern the single-crystal Si-containing layer prior to heating. When this embodiment is employed, lithography and etching are used in forming at least one island comprising a single-crystal Si-containing material atop the barrier layer of the prefabricated SOI substrate.

It is noted that the above method provides a low cost alternative for manufacturing a relaxed SiGe-on-insulator substrate material for use a template for fabricating heterostructures. The heterostructures include at least one strained semiconductor layer, e.g., strained Si, on the relaxed SiGe-on-insulator substrate of the present invention.

DETAILED DESCRIPTION OF THE INVENTION

Figure 1A:
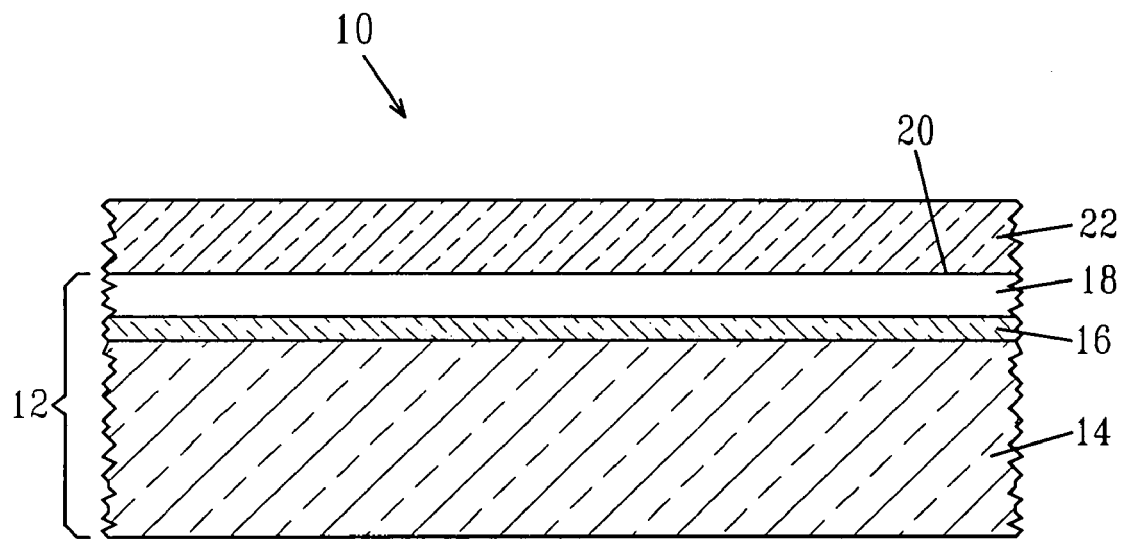
FIGS. 1A–1E are pictorial representations (though cross sectional views) illustrating the basic processing steps of the present invention for fabricating a relaxed, high-quality single-crystal SiGe-on-insulator substrate material. In the embodiment illustrated, a solid Ge-containing source is employed.

The present invention, which provides a low cost alternative for fabricating relaxed, high-quality single-crystal SiGe-on-insulator substrate materials, will now be described in greater detail by referring to the drawings that accompany the present application. It is noted that the drawings of the present application are provided for illustrative purposes and are thus not drawn to scale. Also, in the drawings, like and/or corresponding elements are referred to by like reference numbers.

Reference is first made to the structure 10 shown in FIG. 1A. Specifically, the structure 10 includes a prefabricated silicon-on-insulator (SOI) substrate 12 that has an unstrained Ge-containing layer 22 on a single-crystal Si-containing surface 20 of a single-crystal Si-containing layer 18. The Si-containing layer 18 is located on a barrier layer 16 that is resistant to Ge diffusion. The barrier layer 16 is located on a semiconductor substrate 14. Layers 18, 16 and 14 are components of the SOI substrate 12. The barrier layer 16 may be continuously present throughout the entire structure, as shown, or it can exist as discrete and isolated regions (or islands) that are surrounded by layers 18 and 14.

The prefabricated SOI substrate 12 may be formed utilizing conventional SIMOX (separation by ion implantation of oxygen) processes well-known to those skilled in the art, as well as the various SIMOX processes mentioned in co-assigned U.S. patent application Ser. No. 09/861,593, filed May 21, 2001, now U.S. Pat. No. 6,486,037, issued Nov. 26, 2002; Ser. No. 09/861,594, filed May 21, 2001, now U.S. Pat. No. 6,602,757, issued Aug. 5, 2003; Ser. No. 09/861,590, filed May 21, 2001; Ser. No. 09/861,596, filed May 21, 2001, now U.S. Pat. No. 6,541,356, issued Apr. 1, 2003; and Ser. No. 09/884,670, filed Jun. 19, 2001 as well as U.S. Pat. No. 5,930,634 to Sadana, et al., the entire contents of each are being incorporated herein by reference. Note that the process disclosed in the '590 application can be employed herein to fabricate the patterned substrate.

Alternatively, the SOI substrate 12 may be made using other conventional processes including, for example, a layer transfer process including a thermal bonding step. Additionally, the SOI substrate 12 may be an SOI-like structure that can be made using conventional deposition processes as well as lithography and etching (employed when fabricating a patterned substrate). Specifically, when SOI-like substrates are employed as substrate 12, the substrate is formed by depositing a Ge diffusion barrier layer 16 atop a surface of a semiconductor substrate 14, via conventional deposition, thermal growing processes or atomic layer deposition (ALD); optionally patterning the barrier layer 16 by employing conventional lithography and etching; and thereafter forming a Si-containing layer 18 atop the barrier layer 16 using conventional deposition processes including chemical vapor deposition (CVD), plasma-assisted CVD, sputtering, evaporation, chemical solution deposition or epitaxial Si growth.

In accordance with the present invention, the semiconductor substrate 14 of SOI substrate 12 comprises a semiconductor material including, for example, Si, SiGe, SiC, SiGeC, GaAs, InAs, InP and other III/V or II/VI compound semiconductors. The thickness of the semiconductor substrate 14 is inconsequential to the present invention. The semiconductor substrate 14 may have any crystal orientation including, for example, (100), (111) or (110).

The barrier layer 16 of the SOI substrate 12 comprises any insulating material that is highly resistant to Ge diffusion. Examples of such insulating and Ge diffusion resistant materials include, but are not limited to: crystalline or non-crystalline oxides or nitrides. The barrier layer 16 typically has a thickness from about 1 to about 1000 nm, with a thickness from about 20 to about 200 nm being more typical.

The Si-containing layer 18 of SOI substrate 12 comprises a single crystal semiconductor material that includes at least silicon. Illustrative examples of such "Si-containing" materials include, but are not limited to: Si, SiGe, SiC, SiGeC, Si/Si, Si/SiC, Si/SiGeC, and preformed silicon-on-insulators which may include any number of buried insulating (continuous, non-continuous or mixtures of continuous and non-continuous) regions present therein. Typically, the Si-containing layer 18 is a single-crystal Si layer. Layer 18 can have the same or different crystallographic orientation as substrate 14.

The Si-containing layer 18 is a relatively thin layer whose thickness is from about 50 nm or less, with a thickness from about 5 to about 30 nm being more typical. The desired thickness of the Si-containing layer 18 can be obtained by cutting, proper choice of implantation conditions, proper choice of deposition, etching, planarization or oxidation-based thinning of thicker SOI layers 18.

In some embodiments of the present invention, it may be preferred to clean the single crystal surface 20 of the Si-containing layer 18 prior to forming the unstrained Ge-containing layer 22 thereon. By cleaning the surface prior to forming the unstrained Ge-containing layer 12, contaminants at the growth interface (i.e., surface 20) are likely to create unwanted defects during the heating step to be subsequently described hereinbelow. Although any surface precleaning process can be used in the present invention, it is preferred that HF-last based pre-cleaning techniques be used. The cleaning step ensures that a high-quality interface is present for forming the unstrained Ge-containing layer 22 thereon.

Another possible precleaning method is to subject the prefabricated SOI substrate 12 to a baking step which is performed in the presence of a hydrogen-containing ambient. The baking step is performed at a temperature from about 650° to about 1150° C., with a temperature from about 750° to about 1000° C. being more typical. The baking step can be performed for various periods of time, with a time period from about 0.5 to about 5 minutes being typical.

Next, the unstrained Ge-containing layer 22 is formed on surface 20 of the Si-containing layer 18. The term "unstrained" is used herein to denote that the Ge-containing layer 22 formed in the present invention has substantially little or no strain associated therewith. Quantitatively, this means that the Ge-containing layer 22 has a measured strain value of about 0.01% or less.

The term "Ge-containing" denotes that layer 22 can comprise pure Ge or a SiGe alloy layer that includes up to 99.99, more preferably from about 0.1 to about 99, and even more preferably from about 10 to about 35, atomic percent Ge.

The unstrained Ge-containing layer 22 is formed by exposing the SOI substrate 12 to a solid, unstrained Ge-containing source. The solid, unstrained Ge-containing source includes any solid material that contains Ge; the terms "unstrained" and "Ge-containing" have the same meaning as defined above. Illustrative examples of unstrained, solid Ge-containing sources that can be employed in the present invention include, but are not limited to: Ge-containing glasses, amorphous Ge-containing (pure Ge or SiGe) materials, polycrystalline Ge-containing materials and mixtures thereof. The unstrained Ge-containing layer 22 may be formed by a conventional deposition process including, for example, chemical vapor deposition, plasma enhanced chemical vapor deposition, sputtering, thermal or electron-beam evaporation, and the like.

The unstrained Ge-containing layer 22 can be formed to any thickness and the content of Ge in the layer is not restricted as is the case with strained SiGe layers formed by epitaxy. Typically, the unstrained Ge-containing layer 22 has a thickness from about 10 to about 5000 nm, with a thickness from about 30 to about 2000 nm being more typical.

Figure 1B:
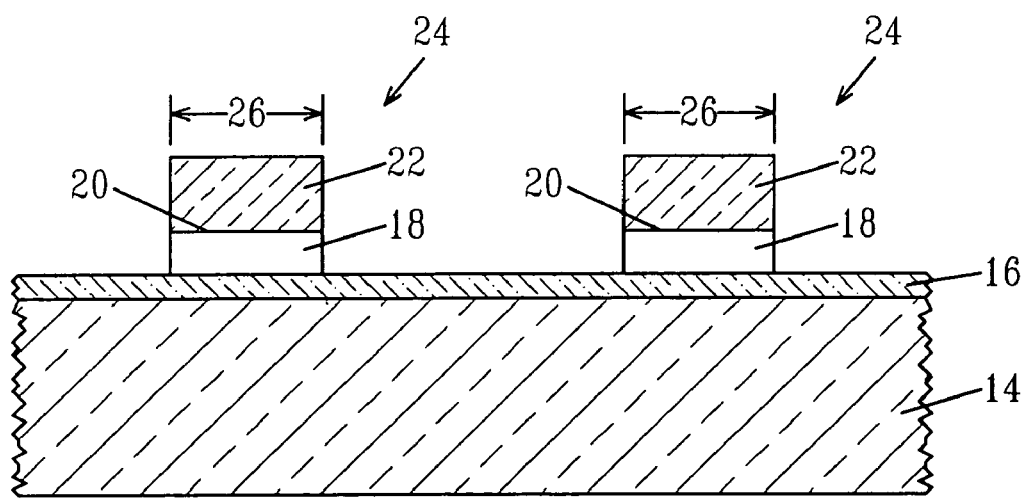

At this point of the present invention, and as shown in FIG. 1B, the structure of FIG. 1A can be subjected to a patterning step such that the unstrained Ge-containing layer 22 and the underlying Si-containing layer 18 are patterned into discrete and isolated islands 24. The patterning step is optional and thus it is not preformed in all circumstances.

The patterning step comprises first applying a photoresist (not shown) to the surface of the unstrained Ge-containing layer 22. The photoresist is then exposed to a pattern of radiation and thereafter the exposed photoresist is developed using a conventional resist developer. Patterning continues by removing the exposed portions of the unstrained Ge-containing layer 22 and underlying Si-containing layer 18, not protected by the photoresist, utilizing at least one etching process. The at least one etching process may comprise a wet etch process, a dry etch process or a combination thereof.

After the at least one etching process is preformed, the photoresist is removed from the structure utilizing a conventional stripping process. The width 26 of islands 24 may vary, but typically, the width 26 of each island 24 is from about 0.1 to about 100 μm.

Next, the structure shown in either FIG. 1A or FIG. 1B is subjected to a heating step that, in this embodiment of the present invention, causes diffusion of Ge from layer 22 into the single-crystal Si-containing layer 18 thereby forming a relaxed, single-crystal SiGe alloy layer 28 on the barrier layer 16 of the prefabricated SOI substrate 12. Specifically, the heating step of the present invention is performed at a temperature which permits interdiffusion of Ge throughout the single-crystal Si-containing layer 18, and unstrained Ge-containing layer 22 thereby forming substantially relaxed, single crystal SiGe alloy layer 28 atop the barrier layer 16.

Figure 1C:
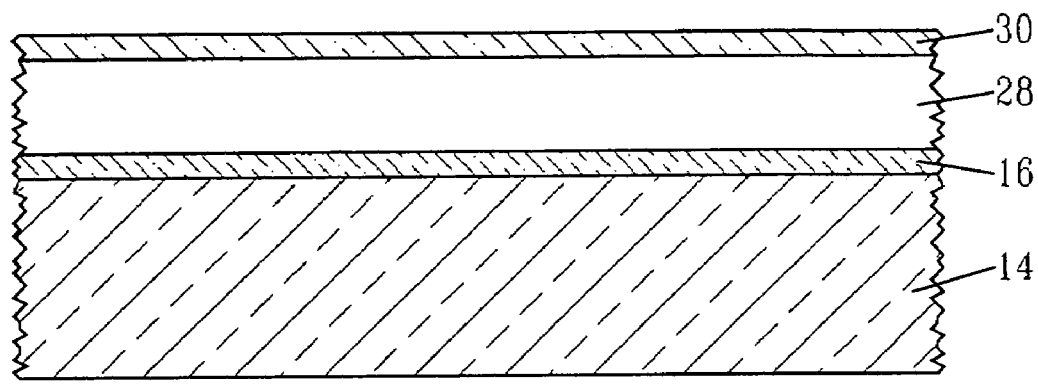
Figure 1D:
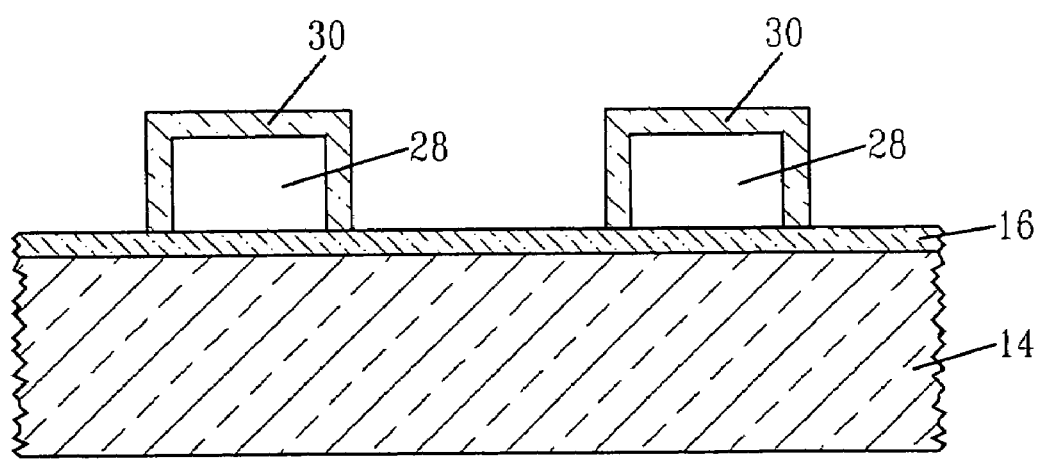
Figure 1E:
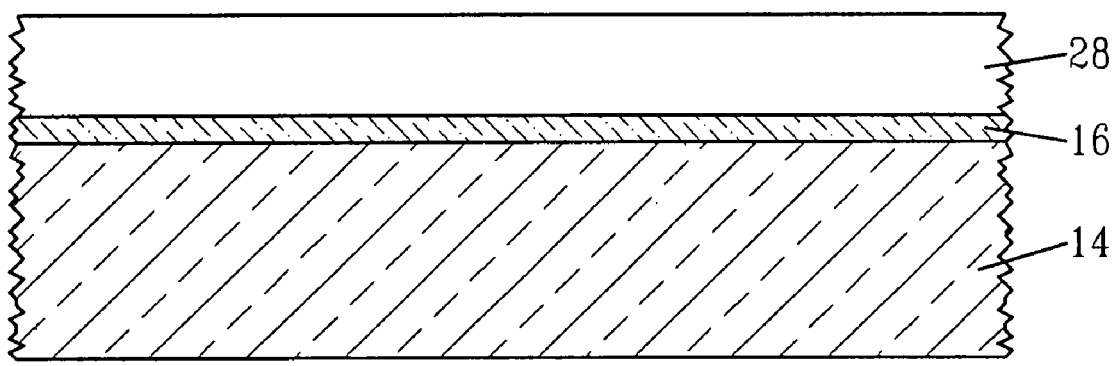

FIG. 1C shows the resultant structure that is formed after the heating step of the present invention has been performed on the structure of FIG. 1A, while FIG. 1D shows the structure that is formed after performing the heating step of the present invention on the structure shown in FIG. 1B. Note that oxide layer 30 is formed atop layer 28 in each structure during the heating step. This oxide layer is also present on the sidewalls of the islands, as shown. This oxide layer 30 is typically, but not always, removed from the structure after the heating step using a conventional wet etch process wherein a chemical etchant such as HF that has a high selectivity for removing oxide, as compared to SiGe, is employed. FIG. 1E shows the structure of FIG. 1C after oxide removal. A similar structure would be obtained when the surface oxide is removed from FIG. 1D.

Note that when the oxide layer 30 is removed, a single crystal Si-containing layer can be formed atop layer (not shown) and the above processing steps of the present invention may be repeated any number of times to produce a multilayered relaxed SiGe substrate material.

The oxide layer 30 formed after the heating step of the present invention has a variable thickness which may range from about 5 to about 1000 nm, with a thickness from about 10 to about 500 nm being more highly preferred.

Specifically, the heating step of the present invention is an annealing/oxidation step that is performed at a high temperature from about 900° C. to about 1350° C., with a temperature from about 1200° C. to about 1335° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time that typically ranges from about 10 to about 1800 minutes, with a time period from about 60 to about 600 minutes being more highly preferred. The heating step may be carried out at a single targeted temperature, or various ramp and soak cycles using various ramp rates, soak times and ambients can be employed.

The heating step is performed under an oxidizing ambient to achieve the presence of a surface oxide layer, i.e., layer 30, which acts as a diffusion barrier to Ge atoms. Therefore, once the oxide layer 30 is formed on the surface of the structure (including top surface and sidewalls), Ge becomes trapped between barrier layer 16 and oxide layer 30. As the surface oxide increases in thickness, the Ge becomes more uniformly distributed throughout layers 18 and 20, but it is continually and efficiently rejected from the encroaching oxide layer. So during heating, the unstrained Ge-containing layer 22 is consumed and the relative Ge fraction increases in Si-containing layer 18. Thus, the heating step of the present invention can be referred to as a thermal mixing process. Also, during the heating step of the present invention equilibrium conditions are maintained and the strain that develops as a result of the Ge flux into the Si lattice is relieved by defect production and annihilation or elastic expansion as is the case for the structure containing islands 24.

Efficient thermal mixing is achieved in the present invention when the heating step is carried out at a temperature from about 1200° C. to about 1320° C. in a diluted oxygen-containing gas. It is also contemplated herein to use a tailored heat cycle that is based upon the melting point of the SiGe layer. In such an instance, the temperature is adjusted to tract just below the melting point of the SiGe layer. Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the high-temperature heating step of the present invention is (1) to form a barrier layer 30 that is resistant to Ge diffusion on the unstrained Ge-containing layer: (2) to allow Ge atoms to diffuse more quickly thereby maintaining a homogeneous distribution during annealing; (3) to subject the initial layered structure to a thermal budget which will facilitate an equilibrium configuration; and (4) relieve strain in the Si-containing layer caused by the flux of Ge into that layer. After this heating step has been performed, the structure includes a uniform and substantially relaxed SiGe alloy layer, i.e., layer 28, sandwiched between the barrier layer 16 and surface oxide layer 30.

In accordance with the present invention, the substantially relaxed SiGe layer 28 has a thickness of about 2000 nm or less, with a thickness from about 10 to about 200 nm being more highly preferred. Note that the substantially relaxed SiGe layer 28 formed in the present invention is a high-quality layer having a defect density including misfits, threading dislocations (TDs), stacking fault, and microtwins, of less than about $5 \times 10^7$ defects/cm$^2$.

The substantially relaxed SiGe layer 28 formed in the present invention has a final Ge content of from about 0.1 to about 99.9 atomic percent, with an atomic percent of Ge from about 10 to about 35 being more highly preferred. Another characteristic feature of the substantially relaxed SiGe layer 28 is that it has a measured lattice relaxation from about 1 to about 100%, with a measured lattice relaxation from about 50 to about 90% being more highly preferred.

The structure shown in FIG. 1E (and FIG. 1D without surface oxide layer 30) can be used as a template for growing at least one strained semiconductor layer thereon. Illustrative examples of strained semiconductors layers include, but are not limited to: Si, SiGe, InAs, GaAs, GaP or the like including mulitlayers.

FIGS. 2A–2E shows the processing steps employed in a second embodiment of the present invention. This embodiment differs from the embodiment described above in that the prefabricated SOI substrate is exposed to a gaseous or ion Ge-containing source that is unstrained. In this embodiment, no unstrained Ge-containing layer forms atop the Si-containing layer of the prefabricated SOI substrate. Instead, exposing the SOI substrate to a gaseous or ion Ge-containing source introduces Ge into the Si-containing surface. After, or during, the introduction of Ge into the Si-containing layer, the structure is heated, i.e., annealed and/or oxidized such that the Ge diffuses throughout the Si-containing layer and relaxation occurs. The result of the second embodiment is the formation of a relaxed SiGe-on-insulator. The second embodiment of the present invention will now be described in greater detail.

Figure 2A:
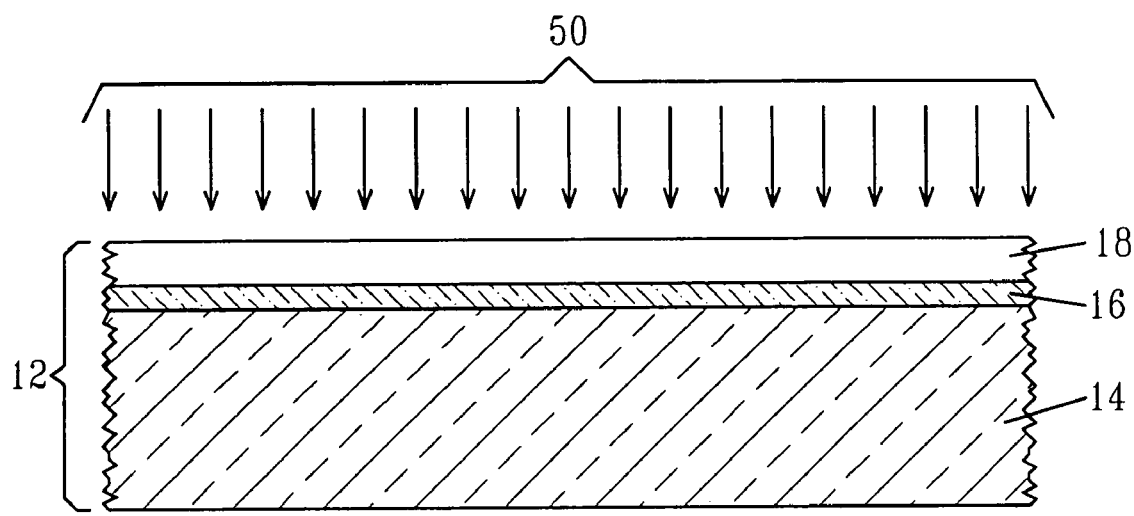
FIGS. 2A–2E are pictorial representations (though cross sectional views) illustrating the basic processing steps of an alternative embodiment of the present invention for fabricating a relaxed, high-quality single-crystal SiGe-on-insulator substrate material. In the embodiment illustrated, a gaseous or ion Ge-containing source is employed.

In the second embodiment, a prefabricated SOI substrate 12, such as described in the first embodiment, is exposed to a gaseous Ge-containing source or ions of Ge. The structure during this exposing step is shown in FIG. 2A. Reference numeral 50 denotes the gaseous Ge-containing source or Ge ions being introduced into the Si-containing layer 18 of the prefabricated SOI substrate 12.

The gaseous Ge-containing source 50 includes any gas that includes unstrained Ge. Illustrative examples of gaseous Ge-containing sources that can be employed in the present invention include, but are not limited to: Ge, Ge/HCl, GeH$_4$, GeCl$_4$, or other Ge-containing gases or liquids. The gaseous Ge-containing source may include isotopically enriched Ge.

The gaseous Ge-containing sources are introduced into the Si-containing layer 18 by flowing the gaseous Ge-containing source 50 over the prefabricated SOI substrate 12. The conditions for exposing the prefabricated SOI substrate 12 to the gaseous Ge-containing source 50 may vary and could be chosen by one skilled in the art.

Typically, the gaseous Ge-containing source is introduced into the Si-containing layer 18 of the prefabricated SOI substrate by flowing a gas containing at least Ge over the SOI substrate at a temperature from about 550° to about 1150° C. for a time period from about 1 to about 100 minutes. More typically, the gaseous Ge-containing source is introduced into the Si-containing layer of the SOI substrate at a temperature from about 850° to about 1100° C. for a time period from about 10 to about 60 minutes. Typical flow rates for introducing the gaseous Ge-containing source into the Si-containing layer that can be used in the present invention include from about 5 to about 5000 sccm, with a flow rate from about 10 to about 1000 sccm being more typical.

In some embodiments when the gaseous Ge-containing source comprises GeH$_4$ and HCl simultaneous growth and etching occurs. The zero growth condition occurs when an equilibrium between the GeH$_4$ and HCl is established.

In another embodiment, the unstrained Ge-containing source could comprises a Ge-containing ion source 50 that are introduced into the Si-containing layer 18 by ion implantation. While the conditions for the ion implantation may vary and could be selected by one skilled in the art, it is important to chose implant conditions that introduce the peak concentration of Ge into the Si-containing layer 18. For example, the following implant conditions can be employed in the present invention: 10 to 100 keV Ge implantation at a dose ranging from 1E16 Ge/cm$^2$ to 5E17 Ge/cm$^2$. Implantation carried out at elevated temperatures (between 100° and 700° C.) is contemplated herein to prevent amorphization of the Si-containing layer 18.

Figure 2B:
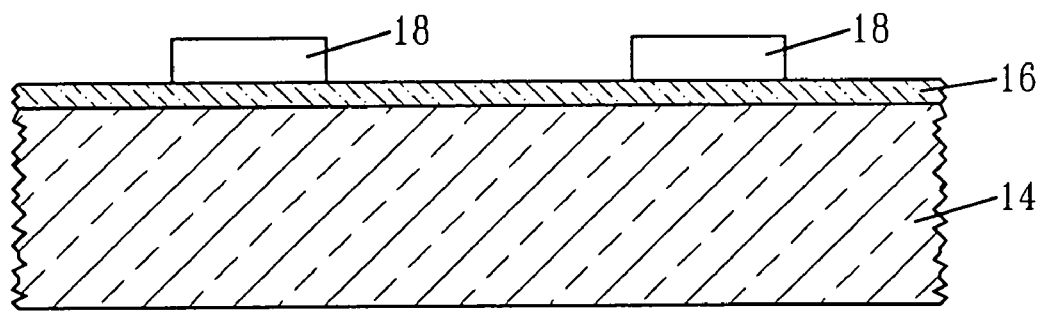

FIG. 2B shows a structure that is formed after patterning the prefabricated SOI wafer. Note that the patterning may occur before or after the exposing step mentioned above. Patterning is achieved by the technique described in the first embodiment above.

Figure 2C:
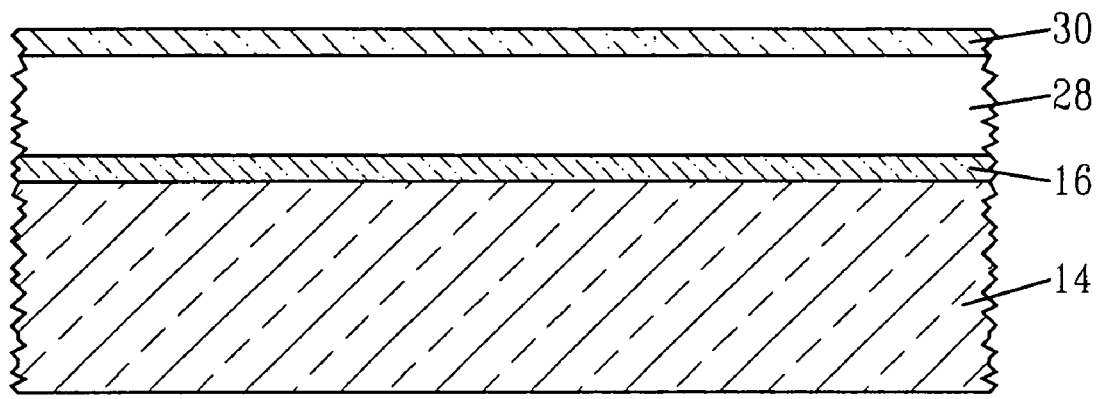
Figure 2D:
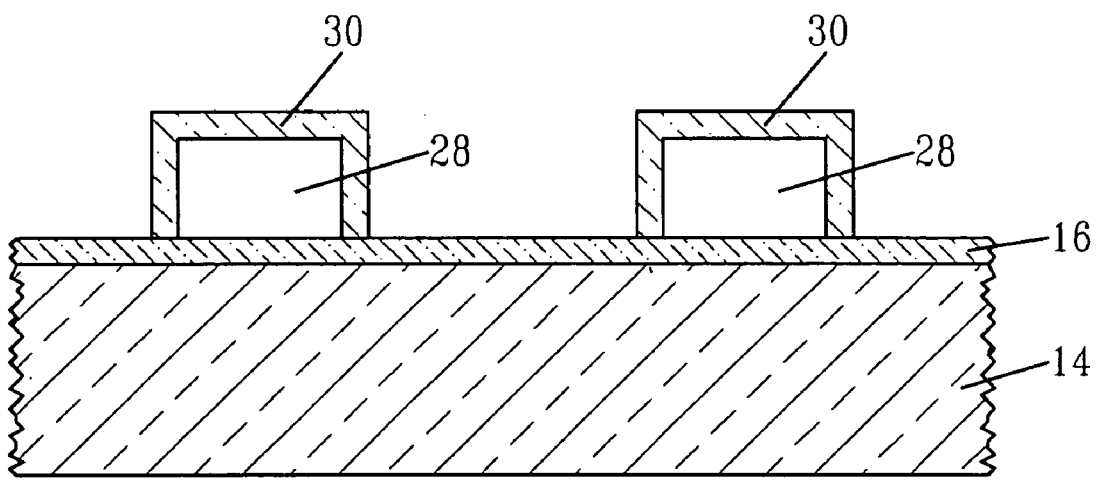
Figure 2E:
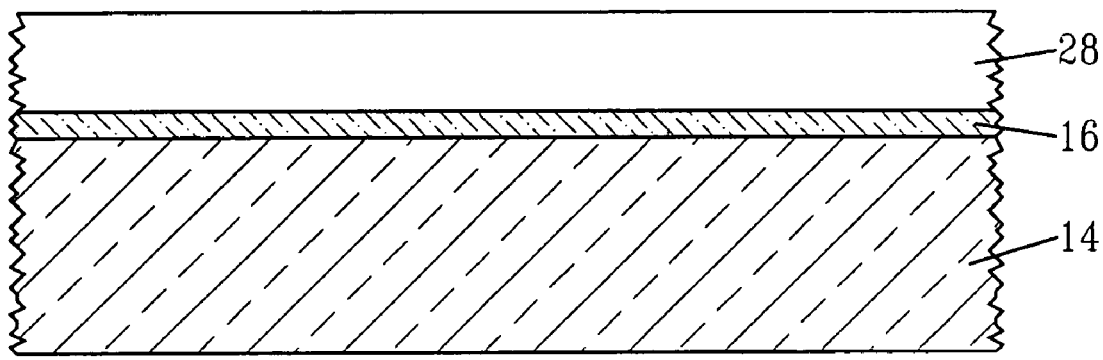

The structure shown in FIG. 2A or 2B is then heated using the conditions described above in the first embodiment such that Ge diffusions throughout the Si-containing layer 18 and subsequent relaxation of the subsequently formed SiGe layer occurs. The resultant structures, including unpatterned and patterned, are shown in FIGS. 2C and 2D, respectively. As in the first embodiment, surface oxide layer 30 forms atop the relaxed SiGe layer 28, as well as the sidewalls thereof during the heating step. The surface oxide layer 30 can be removed as described above providing a substrate material that could be used as a template for forming semiconductor heterostructures that include at least one strained semiconductor layer atop the relaxed SiGe layer 28. FIG. 2E shows the structure of FIG. 2C after oxide removal. A similar structure would be obtained when the surface oxide is removed from the patterned structure shown in FIG. 2D.

The following is an example in which an unstrained Ge-containing layer was formed on a surface of a prefabricated SOI substrate and thereafter that structure was heated using the conditions described above to provide a relaxed SiGe-on-insulator substrate.

EXAMPLE

Figure 3:
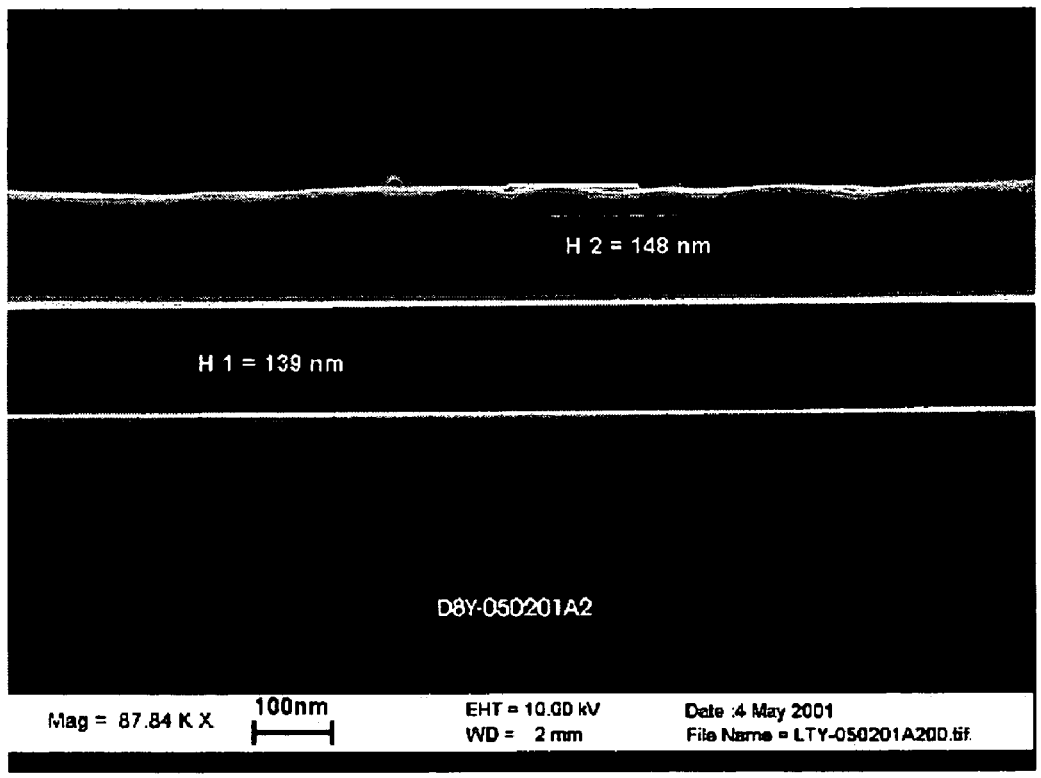
FIG. 3 is a cross sectional SEM image showing the final relaxed SiGe-on-insulator (SGOI) substrate formed in the example of the present invention.

In this example, the solid source employed was a 1000 Å amorphous Ge (approximately 15 atomic % Ge) layer which was sputtered onto a prefabricated SOI wafer. The sample was then subjected to a high-temperature annealing/oxidation step which consisted of a 1200° C. soak flowing $O_2$ diluted with $N_2$, and then a 1320° C. soak under the same ambient. Under these conditions, which are representative of the present invention, Ge from the unstrained Ge layer diffuses into the single crystal Si layer, while at the same time forming a surface oxide which acts a diffusion barrier to Ge. As oxidation processed, the unstrained, amorphous SiGe layer was consumed, while the total Ge content was maintained. The result of the heating step was the formation of a relaxed SiGe-on-insulator as shown in FIG. 3. In FIG. 3, H2 denotes the relaxed SiGe layer (148 nm) and H1 is the buried oxide layer (139 nm). X-ray diffraction performed on this material indicated that the Ge content was 10.2 atomic % and the relaxation was 95.7%.

While the present invention has been particularly shown and described with respect to preferred embodiments thereof, it will be understood by those skilled in the art that the foregoing and other changes in forms and details made be made without departing from the spirit and scope of the present invention. It is therefore intended that the present invention not be limited to the exact forms and details described and illustrated, but fall within the scope of the appended claims.

We claim:

1. A method of fabricating a relaxed, high-quality single-crystal SiGe-on-insulator substrate material comprising the steps of:
    exposing a single-crystal Si-containing layer of a prefabricated silicon-on-insulator substrate to an unstrained Ge-containing source; and
    heating the substrate exposed to said unstrained Ge-containing source to cause diffusion of Ge provided by said unstrained Ge-containing source into said single-crystal Si-containing layer thereby forming a relaxed, single-crystal SiGe alloy layer on a barrier layer of said prefabricated SOI substrate.

2. The method of claim 1 wherein said silicon-on-insulator is formed by a layer transfer process.

3. The method of claim 1 wherein said silicon-on-insulator is formed by a separation by an ion implantation of oxygen process.

4. The method of claim 1 wherein said barrier layer is resistant to Ge diffusion.

5. The method of claim 4 wherein said barrier layer comprises a crystalline or non-crystalline oxide or nitride.

6. The method of claim 1 wherein said Si-containing layer comprises a semiconductor material containing Si.

7. The method of claim 6 wherein said Si-containing layer comprises Si, SiGe, SiC, SiGeC, Si/Si, Si.SiGe, Si/SiGeC or a preformed silicon-on-insulator containing any number of buried insulating layers that can be patterned, unpatterned or both patterned and unpatterned.

8. The method of claim 7 wherein said Si-containing layer comprises Si.

9. The method of claim 1 wherein said unstrained Ge-containing source comprises a solid Ge-containing source, a gaseous Ge-containing source or Ge-containing ions.

10. The method of claim 9 wherein said unstrained Ge-containing source comprises said solid Ge-containing source.

11. The method of claim 10 wherein said solid Ge-containing source comprises Ge-containing glasses, amorphous Ge-containing materials, or polycrystalline Ge-containing materials and mixtures thereof.

12. The method of claim 10 wherein said solid Ge-containing source is an unstrained Ge-containing layer formed atop the single crystal Si-containing layer by deposition.

13. The method of claim 9 wherein said unstained Ge-containing source comprises said gaseous Ge-containing source.

14. The method of claim 13 wherein said gaseous Ge-containing source comprises a mixture of $GeH_4$ and HCl.

15. The method of claim 13 wherein said gaseous Ge-containing source is provided at a temperature from about 550° to about 1150° C., a flow rate from about 5 to about 5000 sccm, and a time period from about 1 to about 100 minutes.

16. The method of claim 9 wherein said unstrained Ge-containing source comprises said ions of Ge.

17. The method of claim 16 wherein said ions of Ge are provided by ion implantation.

18. The method of claim 17 wherein said ion implantation is performed at a Ge ion dose from about $1 \times 10^{16}$ to about $5 \times 10^{17}$ atoms/cm$^3$, and a energy from about 10 to about 100 keV.

19. The method of claim 1 further comprising patterning the silicon-on-insulator wafer prior to the exposing step or following the exposing step.

20. The method of claim 1 wherein said heating is performed at a temperature from about 900° to about 1350° C. in an oxidizing ambient.

21. The method of claim 20 wherein said oxidizing ambient includes an oxygen-containing gas that is optionally diluted with an inert gas.

22. The method of claim 1 wherein said heating is performed at a temperature from about 1200° to about 1320° C. in a diluted oxygen-containing gas.

23. The method of claim 1 wherein said heating forms a surface oxide layer that is resistant to Ge diffusion.

24. The method of claim 1 further comprising forming at least one strained semiconductor layer on the relaxed, single-crystal SiGe alloy layer.

* * * * *